(12) United States Patent
Mehta

(10) Patent No.: US 7,098,575 B2
(45) Date of Patent: Aug. 29, 2006

(54) BAW DEVICE AND METHOD FOR SWITCHING A BAW DEVICE

(75) Inventor: Sarabjit Mehta, Calabasas, CA (US)

(73) Assignee: HRL Laboratories, LLC, Malibu, CA (US)

( * ) Notice: Subject to any disclaimer, the term of this patent is extended or adjusted under 35 U.S.C. 154(b) by 171 days.

(21) Appl. No.: 10/826,493

(22) Filed: Apr. 16, 2004

(65) Prior Publication Data

US 2004/0207291 A1    Oct. 21, 2004

Related U.S. Application Data

(60) Provisional application No. 60/464,252, filed on Apr. 21, 2003.

(51) Int. Cl.
*H01L 41/08* (2006.01)
(52) U.S. Cl. .................... 310/324; 310/320
(58) Field of Classification Search ............ 310/317, 310/322, 324, 330–332, 358
See application file for complete search history.

(56) References Cited

U.S. PATENT DOCUMENTS 6,198,208 B1 * 3/2001 Yano et al. ............... 310/358
6,300,706 B1 * 10/2001 Grudkowski et al. ....... 310/334
6,747,529 B1 * 6/2004 Abe et al. .................. 333/188

OTHER PUBLICATIONS

Arscott, S., et al., "Lead Zirconate Titanate Thin Films on GaAs for Microwave Device Applications," *Proceedings of the 5th International Conference on Solid State and Integrated Circuit Technology*, Beijing, China, p. 587 (1998).
Brooks, K.G., et al., "Orientation of Rapid Thermally Annealed Lead Zirconate Titanate Thin Films on (111) Pt Substrates," *J. Mater. Res.*, vol. 9, No. 10, p. 2540 (1996).
Pozar, D.M., *Microwave Engineering*, Second Edition, John Wiley & Sons, Inc., New York, pp. 196-206 and p. 211 (1991).
Uchino, K., *Piezoelectric Actuators and Ultrasonic Motors*, Kluwer Academic Publishers, Boston, pp. 70-117 and pp. 128-129 (1997).

* cited by examiner

*Primary Examiner*—Mark Budd
(74) *Attorney, Agent, or Firm*—Ladas & Parry LLP

(57) ABSTRACT

A method for switching a bulk acoustic device is disclosed. The bulk acoustic device has a substrate, a first electrode, a second electrode, and a piezoelectric film between the first and the second electrode. Switching is obtained by controlling the polarization of the piezoelectric film, through application of a DC voltage difference to the first and second electrodes. Therefore, no additional switches are needed to direct and control the RF signals passing through the device.

15 Claims, 5 Drawing Sheets

BAW DEVICE AND METHOD FOR SWITCHING A BAW DEVICE

CLAIM OF BENEFIT OF PROVISIONAL APPLICATION

This application claims the benefit of U.S. provisional application Ser. No. 60/464,252 filed on Apr. 21, 2003, which is incorporated herein by reference in its entirety.

BACKGROUND

1. Field

The present disclosure relates to a bulk acoustic (BAW) device and a method for switching ON and OFF a piezoelectric BAW device thin film resonator/filter comprising a piezoelectric film by varying the level of intrinsic polarization in the piezoelectric film.

2. Description of Related Art

A BAW device usually comprises a piezoelectric layer placed between two electrodes. When a radio frequency (RF) signal is applied across the device, a mechanical wave is produced in the piezoelectric layer. The thickness of the piezoelectric layer determines the resonant frequency, and the fundamental resonance occurs when the wavelength of the mechanical wave is about twice the thickness of the piezoelectric layer. As the thickness of the piezoelectric layer is reduced, the resonance frequency is increased.

Prior art BAW devices utilize piezoelectric materials that are strongly or permanently polarized in a preferred direction, where the piezoelectric materials may include AlN, ZnO, or lead zirconate titanate (PZT). The kind of PZT material used in prior art devices is a PZT having a crystal orientation which is predominantly a <111> orientation. See, for example, "Lead zirconate titanate thin films for microwave device applications" by S. Arscott, R. E. Miles, S. J. Milne in IEEE Proc.—Circuits Devices Syst., Vol. 145, No. 5, October 1988. See also "Piezoelectric Actuators and Ultrasonic Motors" by Kenji Uchino, Kluwer Academic Publishers, 1997. AlN and ZnO films are polarized during film fabrication itself, while the <111> oriented PZT films are polarized by applying a DC voltage across the material after fabrication. This provides devices that are permanently active or polarized. Such devices are not suitable for intrinsic switching.

Typical switching of RF signals in BAW devices is achieved by using electrostatic switches or PIN diodes. Those. switches are difficult to fabricate, possess a relatively large size and require actuation voltages, typically as high as 100 V. In addition, electrostatic switches suffer from low yield and reliability issues like stiction. PIN diode switches are very lossy, seriously degrading the device performance, and require additional electronic components and materials.

SUMMARY

According to an embodiment of the present invention, the response of a BAW device is switched ON or bFF by application of a DC bias across a PZT film having a crystal orientation which is predominantly a <100> orientation. The piezoelectric film is preferably about 1 micron thick.

According to a first aspect of the present invention a bulk acoustic wave (BAW) device is disclosed, comprising: a first electrode and a second electrode; and a piezoelectric film located between the first electrode and the second electrode and having a crystal orientation predominantly oriented according to a <100> orientation.

According to a second aspect of the present invention, a method for switching a bulk acoustic wave (BAW) device comprising a first electrode, a second electrode, and a piezoelectric film located between the first electrode and the second electrode is disclosed, the method comprising the steps of: applying a first DC voltage difference value between the first and second electrode; and applying a second DC voltage difference value between the first and second electrode, the second DC voltage difference value reversing electric field direction in the piezoelectric film.

According to a third aspect of the present invention a filter bank having a filter bank input and a filter bank output, and comprising a plurality of bulk acoustic wave (BAW) devices is disclosed, wherein: each BAW device has a device input and a device output, and comprises a first electrode, a second electrode and a piezoelectric film located between the first electrode and the second electrode, each device input being connected with the filter bank input and each device output being connected with the filter bank output; each BAW device has a predetermined frequency band and is switchable between an ON condition and an OFF condition, the ON condition allowing transmission of an RF signal from the device input TO the device output and the OFF condition blocking transmission of the RF signal from the device input to the device output; and one of the BAW devices is in an ON condition and the remaining BAW devices are in an OFF condition, thus allowing RF signals having same frequency band as the frequency band of the BAW device in the ON condition to be transmitted from the filter bank input to the filter bank output.

According to a fourth aspect, a bulk acoustic wave (BAW) device is disclosed, comprising: a first electrode and a second electrode; a piezoelectric film electrically connecting the first electrode to the second electrode and having a polarization controllable by application of an electric field, wherein the first electrode, the second electrode, and the piezoelectric film form a resonator; and a substrate located below the resonator.

According to a fifth aspect, a bulk acoustic wave (BAW) device is disclosed, comprising: a first electrode and a second electrode; and a piezoelectric film electrically connecting the first electrode to the second electrode and having a polarization controllable by application of a tensile stress, wherein the first electrode, the second electrode, and the piezoelectric film form a resonator; and a substrate on which the resonator is located.

In particular, a DC voltage, for example a voltage of 10 to 30 V, is applied to electrodes across the piezoelectric film. The application of the DC voltage aligns the dipoles in the piezoelectric film along the applied field and causes the film to behave as an active BAW resonator/filter when subjected to a radio frequency (RF) signal. However, differently from prior art piezoelectric films, the inventor has observed that a PZT film having a crystal orientation which is predominantly a <100> orientation, for example a crystal orientation which is 70% a <100> orientation and 30% a <111> orientation, is not permanently polarized. In particular, removal of a DC bias or application of a DC voltage to reverse the direction of the electric field in the film will allow the PZT film to return back to its non-polarized state. Therefore, a novel method for switching ON/OFF a BAW device and a novel, switchable, BAW device are disclosed.

A first advantage of the present invention is that no additional switches, such as microelectromechanical (MEMS) switches are needed to direct and control the RF signals. Thus, the problems associated with the elaborate fabrication process, the larger size (about 200 to 500 microns) and the reliability and performance issues of the switches are circumvented.

As a consequence, complicated fabrication processing is not required and the device possesses a very small active area, having, for example, a size of about 50 microns×50 microns. The switching process is simple and extremely robust. Additionally, both the switching arrangement and the BAW response arrangement utilize the same active piezoelectric material and are monolithically integrated.

According to a further embodiment of the present invention, a switched filter bank is provided, where a number of piezoelectric BAW devices, for example PZT BAW devices, is arranged to form a filter with a particular passband response. In particular, multiple filters with different passband responses are arranged in parallel, with a common RF junction at the input and output. By "enabling" only one of the filters at a time, a switch-tuned filter is realized, with the switch "components" built directly into the filters.

The present invention can be used in the area of switchable filter technology, advanced multifunction RF systems, UHF communications, and wireless base stations.

DETAILED DESCRIPTION

Figure 1:
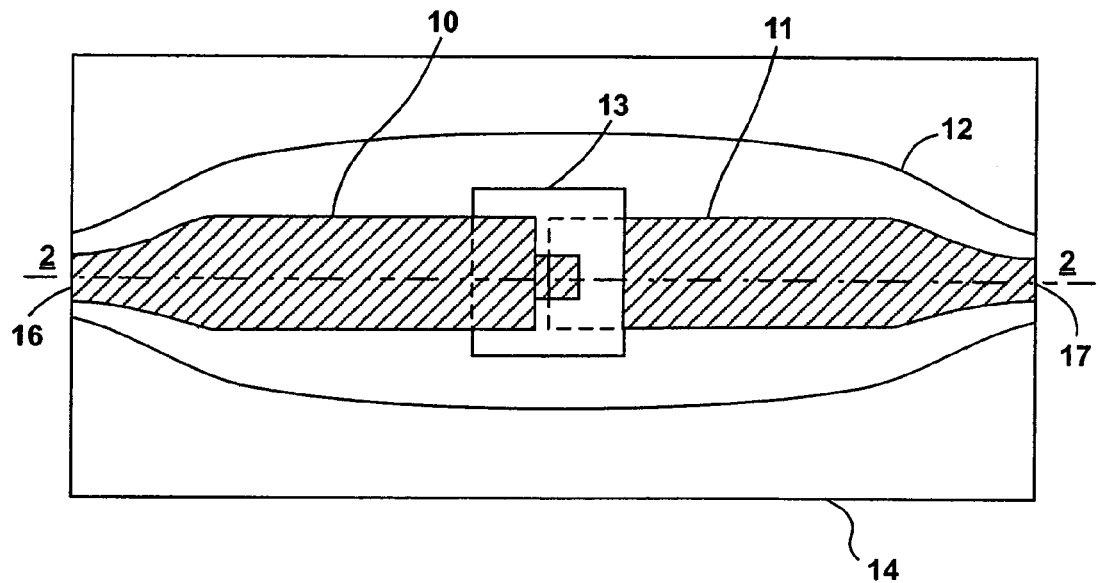
FIG. 1 shows a schematic top plan view of a BAW resonator suitable for a method according to an embodiment of the present invention.
Figure 2:
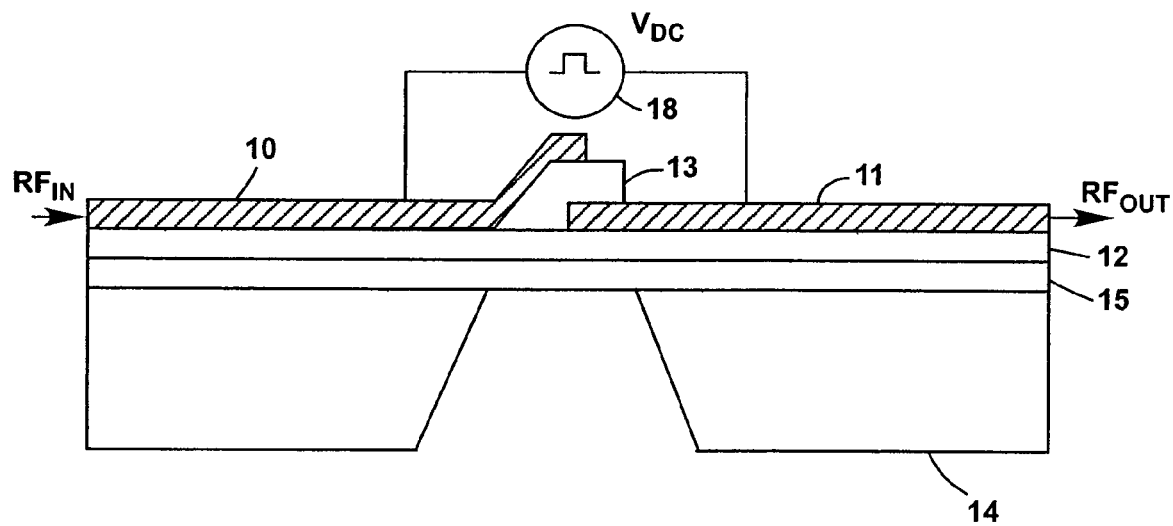
FIG. 2 shows a cross-sectional view taken along line 2—2 of FIG. 1.

FIGS. 1 and 2 show a schematic top plan view and a cross-sectional view taken along 2—2 of FIG. 1, respectively, of a BAW resonator according to an embodiment of the present invention and suitable to be operated in accordance with an embodiment of the method of the present invention. The resonator comprises a first or top electrode 10, a second or bottom electrode 11, a membrane layer 12 and a piezoelectric material 13 placed between the top electrode 10 and the bottom electrode 11. The piezoelectric material is Lead Zirconium Titanate (PZT), predominantly in the <100> orientation. Therefore, the film used in accordance with an embodiment of the present invention differs from prior art PZT films, because those films are mostly <111> oriented.

Figure 6:
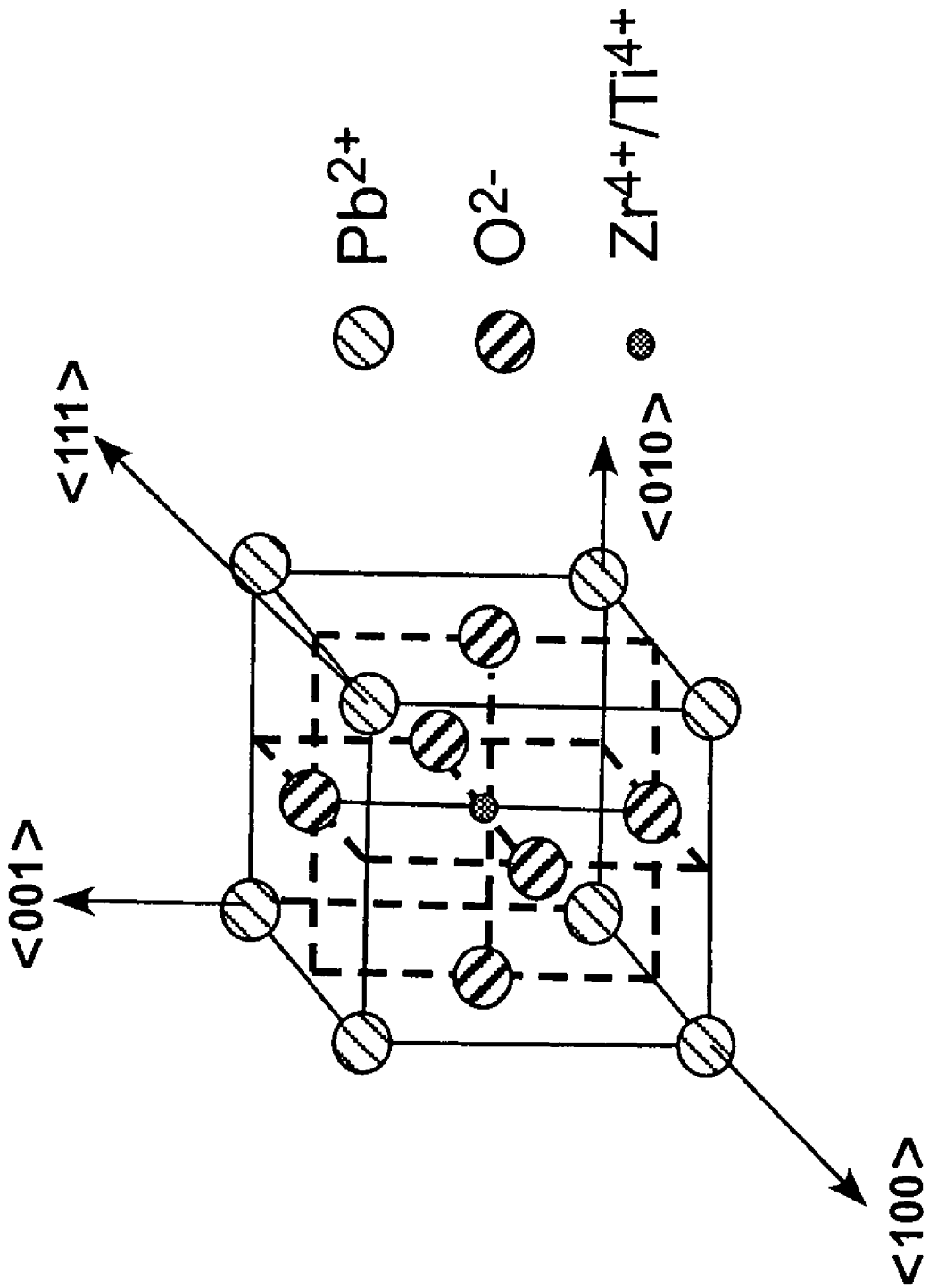
FIG. 6 shows the perovskite structure of PZT above the Curie temperature showing the basic cubic unit cell.

By way of example, FIG. 6 shows the perovskite structure of PZT above the Curie temperature showing the basic cubic unit cell. The <100>, <010>, and <001> directions lie along the sides of the cube, while the <111> direction is along the diagonal.

The PZT orientation depends on the processing conditions, such as the baking and annealing temperatures of the films during fabrication. Changing those conditions allows the desired orientation to be obtained. See, for example, "Orientation of Rapid Thermally Annealed Lead Zirconate Titanate Thin Films on <111> Pt Substrates" by K. G. Brooks et al., J. Mater. Res., Vol. 9, No. 10, p. 2540, October 1994.

Turning to FIG. 1, the resonator is located on a substrate 14, for example a silicon substrate. A layer 15 is preferably located between the substrate and the resonator. Preferably, the first electrode 10 is a chrome/gold 500 Å/5000 Å layer, and the second electrode 11 is a Ti/Pt 100 Å/1000 Å layer. Additionally, the membrane layer 12 is preferably a $TiO_2$ layer having a thickness of about 500 Å, and the layer 15 is preferably a $SiO_2$ layer having a thickness of about 1 μm. The use of such electrodes and layers in BAW devices is well known to the person skilled in the art. The person skilled in the art will also understand that the concepts of the present disclosure can be applied to a variety of BAW device structures and are not limited to the structure shown in FIGS. 1 and 2.

FIG. 2 also shows, schematically, a DC voltage generator 18, connected to the electrodes 10 and 11. When the DC voltage, for example a voltage difference of about 10 to about 30 V, is applied to the electrodes 10 and 11, the dipoles in the region of the piezoelectric film 13 become aligned and cause the film 13 to behave as an active BAW resonator/filter when subjected to a radio frequency (RF) signal.

The DC bias, although schematically shown applied to an intermediate portion of the first and second electrodes, is usually applied to the BAW device by using the input and output RF lines or ports 16, 17 of the first and second electrode, respectively. Therefore, no separate actuation electrodes are needed. Alternatively, a separate input for the DC bias can be provided.

When a DC voltage difference is applied to the electrodes 10, 11, the electric field causes the film to become polarized in a top-to-bottom or bottom-to-top direction, so that the internal dipoles in the film are aligned. On removing the DC bias, or applying a small field to the electrodes, for example 1 to 2 V, in the reverse direction of the original electric field in the film, the net polarization in the film will return to a near zero value, i.e. the internal dipoles will not be aligned anymore.

Once polarization in the film returns to a zero or near-zero value, acoustic resonance in the film is eliminated and the film is no longer an active device, thus switching the device OFF. Therefore, acoustic response can be switched ON or OFF by applying a DC bias across the film, thus switching the polarization inside the film.

A first reason why switchable polarization is observed in the device and method according to the present disclosure is possibly due to the fact that the <100> orientation is more difficult to polarize than the <111> orientation, and hence the internal dipoles in the <100> oriented. PZT films are aligned only when an external DC electric field is present. In this aligned state, the film is polarized and shows a strong acoustic resonance. On removing the external electric field, the internal dipoles are once again misaligned and the film no longer shows a strong acoustic resonance. As a consequence, the device is 'ON' or active only when the external DC electric field is present.

A second possible reason why switchable polarization is observed in the device and method according to the present disclosure is that the fabricated PZT films are under tensile stress, which may prevent permanent polarization in the material. This effect may be independent of the <100> or <111> film orientation. Polarization of the films of either orientation by applying an external electric field would involve crystal deformation that would further increase the tensile stress. Hence, on removing the external DC electric field, the tensile stress would cause the film to return to an unpolarized state.

Additionally, a combination of the above two effects is also possible. Hence, tensile stress and the <100> orientation of the PZT films in the present disclosure may be responsible for the observed reversible polarization.

Figure 3:
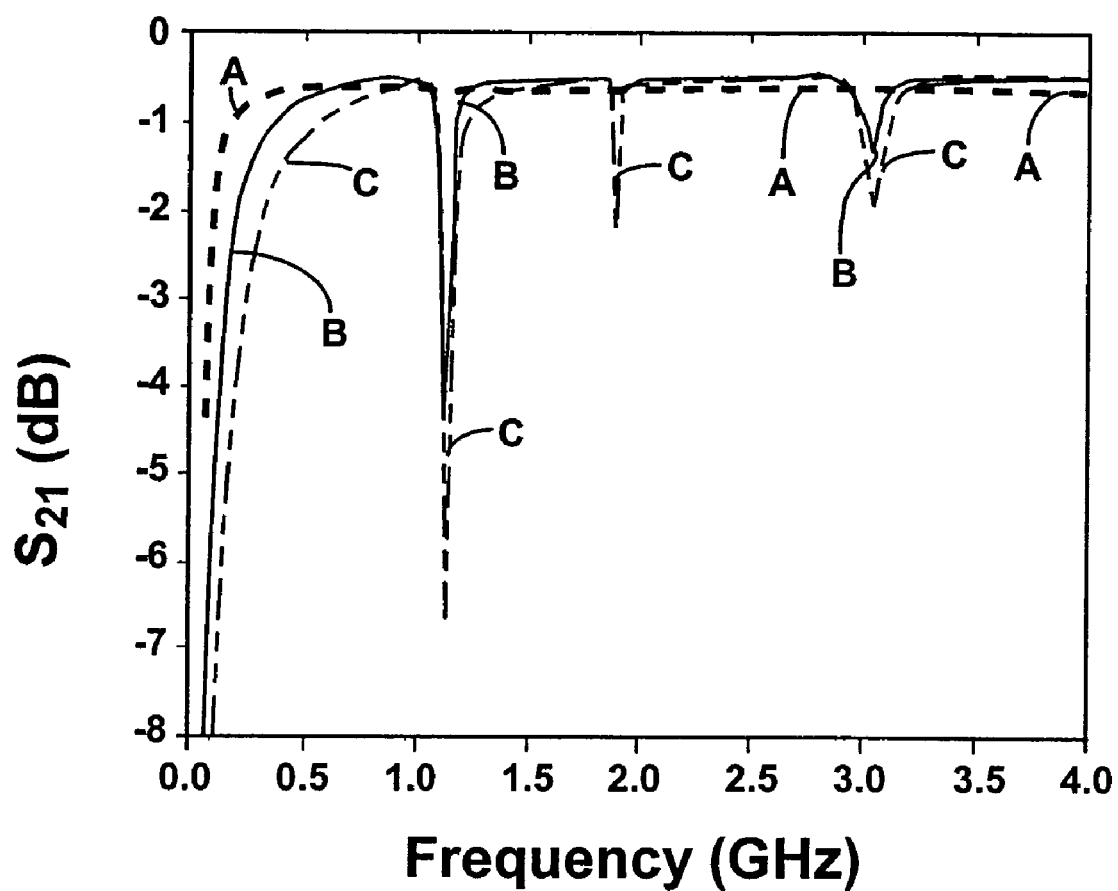
FIG. 3 shows a frequency response diagram of a BAW device operated in accordance with an embodiment of the method of the present invention.

FIG. 3 shows a frequency response diagram of the BAW device according to an embodiment of the present invention, wherein the horizontal axis of the diagram represents frequency (GHz) and the vertical axis shows the RF response measured in terms of the magnitude of the S21 scattering parameter. For a definition of the S21 parameter, see, for example, "Microwave Engineering" by David Pozar, John Wiley & Sons, 1997.

Three waveforms are plotted in FIG. 3, waveforms A, B, and C. Waveform A represents the response of the device in absence of DC bias, where no resonant behavior can be observed. Waveform B represents the response of the circuit in presence of a DC bias of 10 V. Waveform C represents the response of the circuit in presence of a DC bias of 20 V. With waveform C, a resonant behavior at the same frequencies of waveform B above is obtained, the main increase being a slight increase in the amplitude of the response. Resonant behavior at about 1.2 GHz, about 1.9 GHz, and about 3.1 GHz is observed, wherein the peaks at about 1.9 GHz and about 3.1 GHZ represent the higher-order modes of the device.

Figure 4:
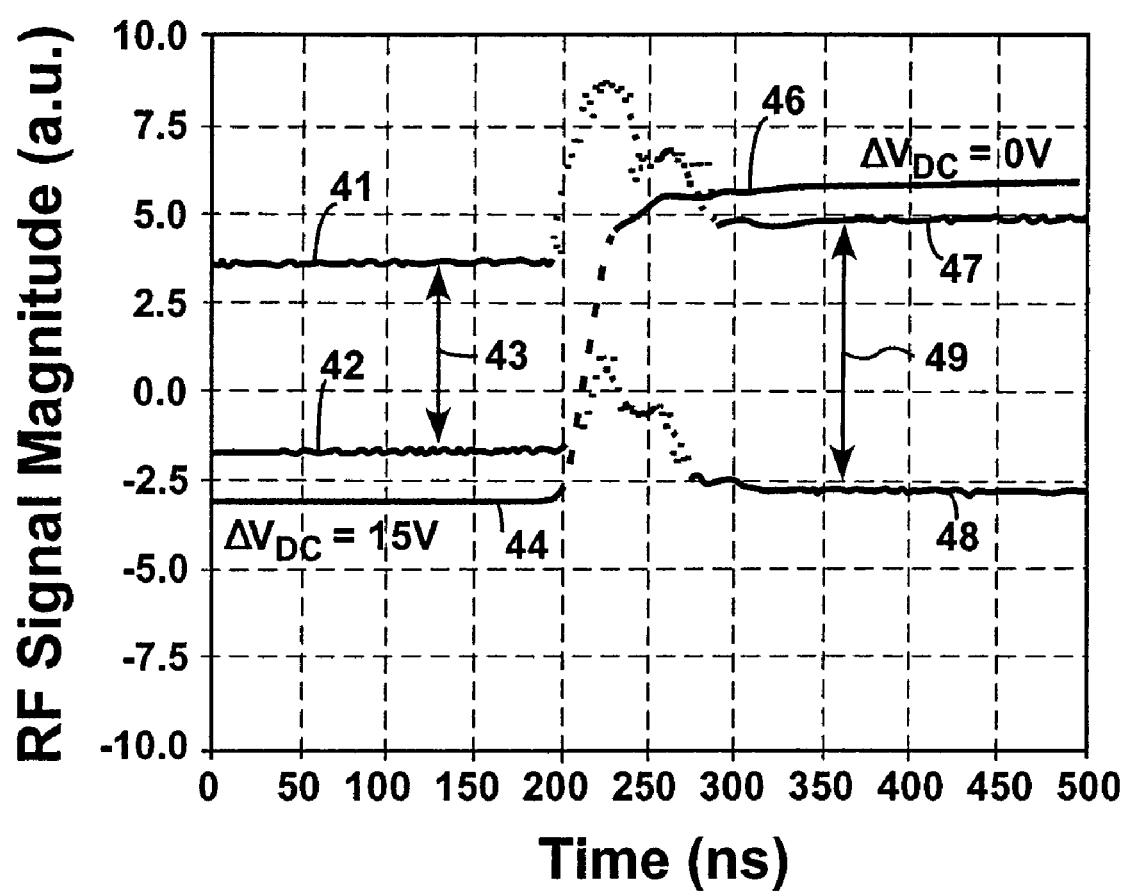
FIG. 4 is a graph showing change in magnitude of an RF signal once the DC bias switches from a first voltage value to a second voltage value.

The device and method according to the present disclosure show an extremely fast switching time of about 1 to 10 ns. An example of the switching behavior is shown in FIG. 4, which is a graph showing change in the magnitude of the RF signal (measured in arbitrary units, a.u.) once the DC bias switches from a first voltage difference value, for example ΔVDC=−15 V, to a second voltage value, for example ΔVDC=0 V. In the graph of FIG. 4, a square wave input (15 V, 1 MHz) has been provided to emulate the DC voltage difference across the PZT film. The RF signal has been transmitted across the device at the resonant frequency of about 1.1 GHz. The graph in FIG. 4 shows a superposition of the modulated RF signal 41, 42, 47, 48 and the square wave voltage 44, 46. In particular, the two values 41, 42 are peak-to-peak values of the same signal. The distance 43 between the values 41, 42 represents an "RF signal OFF" condition, and is experienced when the square wave input has a value of −15 V, as shown by the portion 44 of the square wave input of FIG. 4.

When the square wave input is switched from ΔVDC=−15V to ΔVDC=0V, see portions 45 and 46 of the square wave input, the peak-to-peak values of the RF signal become those represented by the lines 47, 48. Therefore, the distance 49 between the values shown at 47 and 48 is now greater than the distance 43. Such distance represents an "RF signal ON" condition. In particular, the PZT film 13 is polarized while the ΔVDC signal has a value of −15V, and becomes not polarized when the voltage difference switches to 0 V.

From FIG. 4 it is also possible to note that the square wave input has a certain rise time. Therefore, square waves with a rise time better than the rise time shown in the Figure will produce a switching time which is even better than the switching time shown in the figure.

Figure 5A:
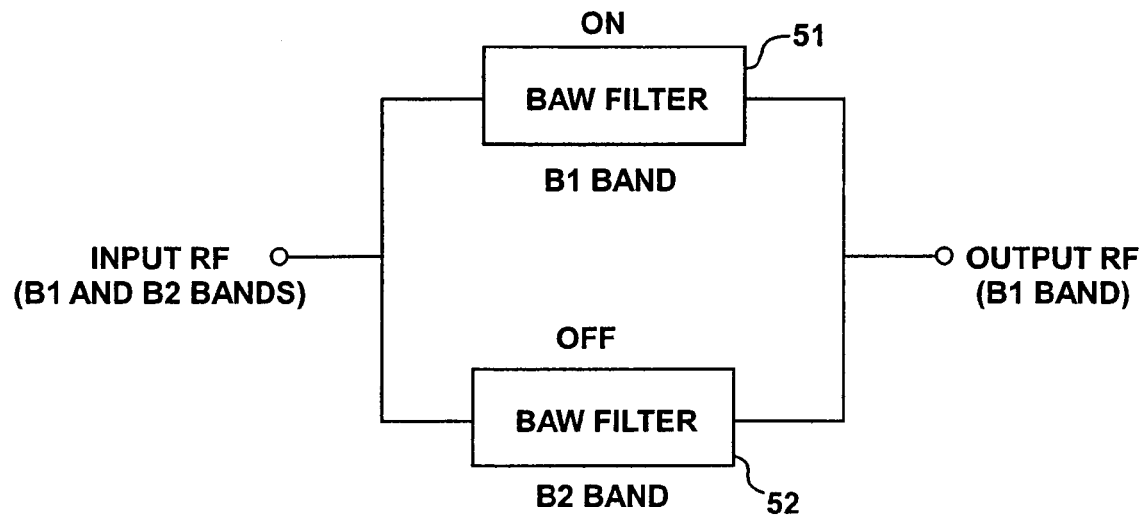
FIGS. 5A and 5B show a further embodiment of the present invention, where a switched filter bank is provided.
Figure 5B:
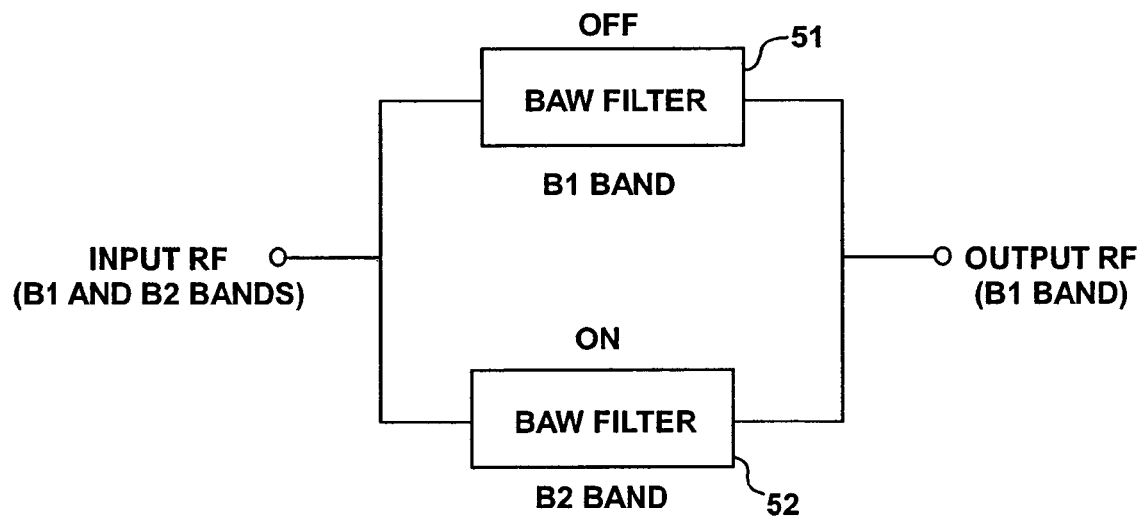

FIGS. 5A and 5B show a schematic description of a BAW filter bank according to an embodiment of the present invention. While only two BAW filter units are shown in FIGS. 5A and 5B, it is to be understood that also filter banks showing more than two units can be provided, based on the same principle of the filter bank shown in the figures.

The input frequency signal is comprised of two frequency bands B1 and B2. The BAW filter 51 is tuned on the frequency band B1 and the BAW filter 52 is tuned on the frequency band B2. In FIG. 5A, the BAW filter 51 is in the 'ON' state and the BAW filter 52 is in the 'OFF' state. Therefore, only the band B1 will be transmitted through the filter bank and the band B2 will be stopped from reaching the output. In FIG. 5B, the BAW filter 51 is in the 'OFF' state and the BAW filter 52 is in the 'ON' state. Therefore, only the band B2 will be transmitted through the filter bank and the band B1 will be stopped from reaching the output. As a consequence, intrinsic switching from a first frequency band to a second frequency band is allowed without need for using electrostatic switches or pin diodes.

While several illustrative embodiments of the invention have been shown and described, numerous variations and alternative embodiments will occur to those skilled in the art. Such variations and alternative embodiments are contemplated, and can be made without departing from the scope of the invention as defined in the appended claims.

What is claimed is:

1. A bulk acoustic wave (BAW) device comprising:
    a first electrode and a second electrode; and
    a piezoelectric film located between the first electrode and the second electrode and having a crystal orientation predominantly oriented according to a <100> orientation,
    wherein the piezoelectric film is switchable between a first electrical condition when a first DC voltage difference value is applied to the first and second electrodes, and a second electrical condition when a second DC voltage difference value, different from the first voltage difference value, is applied to the first and second electrodes.

2. The device of claim 1, wherein the piezoelectric film is a lead zirconium titanate (PZT) film.

3. The device of claim 1, wherein the first electrical condition of the piezoelectric film corresponds to an OFF condition of the BAW device and the second electrical condition of the piezoelectric film corresponds to an ON condition of the BAW device.

4. The device of claim 3, wherein the first electrical condition of the piezoelectric film corresponds to a non-polarized electrical field inside the device and the second electrical condition of the piezoelectric film corresponds to an ON condition of the BAW device.

5. The device of claim 3, wherein the first electrical condition of the piezoelectric film corresponds to a non-polarized electrical field inside the piezoelectric film and the second electrical condition of the piezoelectric film corresponds to a polarized electrical field inside the piezoelectric film.

6. The device of claim 1, wherein the first electrical condition of the piezoelectric film corresponds to an ON condition of the BAW device and the second electrical condition of the piezoelectric film corresponds to an OFF condition of the BAW device.

7. The device of claim 5, wherein the first electrical condition of the piezoelectric film corresponds to a polarized electrical field inside the piezoelectric film and the second electrical condition of the piezoelectric film corresponds to a non-polarized electrical field inside the piezoelectric film.

8. A method for switching a bulk acoustic wave (BAW) device comprising a first electrode, a second electrode, and a piezoelectric film located between the first electrode and the second electrode, the piezoelectric film having a crystal orientation predominantly oriented according to a <100> orientation, the method comprising the steps of:
applying a first DC voltage difference value between the first and second electrode; and
applying a second DC voltage difference value between the first and second electrode, the second DC voltage difference value reversing electric field direction in the piezoelectric film.

9. The method of claim 7, wherein:
the device is in an ON-state after application of the first DC voltage difference value and before application of the second DC voltage difference value; and
the device is in an OFF-state after application of the second DC voltage difference value.

10. The method of claim 7, wherein application of the first DC voltage difference value aligns <100> oriented dipoles in the piezoelectric film and application of the second DC voltage difference value disaligns <100> oriented dipoles in the piezoelectric film.

11. A filter bank having a filter bank input and a filter bank output, and comprising a plurality of bulk acoustic wave (BAW) devices, wherein:
each BAW device has a device input and a device output and comprises a first electrode, a second electrode and a piezoelectric film located between the first electrode and the second electrode, the piezoelectric film having a crystal orientation predominantly oriented according to a <100> orientation, each device input being connected with the filter bank input and each device output being connected with the filter bank output;
each BAW device has a predetermined frequency band and is switchable between an ON condition and an OFF condition, the ON condition allowing transmission of an RF signal from the device input to the device output and the OFF condition blocking transmission of the RF signal from the device input to the device output; and
one of the BAW devices is in an ON condition and the remaining BAW devices are in an OFF condition, thus allowing RF signals having same frequency band as the frequency band of the BAW device in the ON condition to be transmitted from the filter bank input to the filter bank output.

12. The filter bank of claim 10, wherein the piezoelectric film is lead zirconium titanate (PZT) film.

13. The filter bank of claim 10 wherein switching of the BAW devices is obtained by application of a DC voltage difference between the first electrode and the second electrode.

14. A bulk acoustic wave (BAW) device comprising:
a first electrode and a second electrode;
a piezoelectric film electrically connecting the first electrode to the second electrode and having a polarization controllable by application of an electric field, the piezoelectric film having a crystal orientation predominantly oriented according to a <100> orientation, wherein the first electrode, the second electrode, and the piezoelectric film form a resonator; and
a substrate located below the resonaator, wherein the piezoelectric film is switchable between a first electrical condition when a first DC voltage difference value is applied to the first and second electrodes, and a second electrical condition when a second DC voltage difference value, different from the first voltage difference value, is applied to the first and second electrodes.

15. A bulk acoustic wave (BAW) device comprising:
a first electrode and a second electrode;
a piezoelectric film electrically connecting the first electrode to the second electrode and having a polarization controllable by application of a tensile stress, the piezoelectric film having a crystal orientation predominantly oriented according to a <100> orientation, wherein the first electrode, the second electrode, and the piezoelectric film form a resonator; and
a substrate on which the resonator is located,
wherein the piezoelectric film is switchable between a first electrical condition when a first DC voltage difference value is applied to the first and second electrodes, and a second electrical condition when a second DC voltage difference value, different from the first voltage difference value, is applied to the first and second electrodes.

* * * * *